(12) United States Patent
Wen et al.

(10) Patent No.: US 9,034,705 B2
(45) Date of Patent: May 19, 2015

(54) METHOD OF FORMING SEMICONDUCTOR DEVICE

(71) Applicant: United Microelectronics Corp., Hsinchu (TW)

(72) Inventors: Tsai-Yu Wen, Tainan (TW); Tsuo-Wen Lu, Kaohsiung (TW); Yu-Ren Wang, Tainan (TW); Chin-Cheng Chien, Tainan (TW); Tien-Wei Yu, Kaohsiung (TW); Hsin-Kuo Hsu, Kaohsiung (TW); Yu-Shu Lin, Pingtung County (TW); Szu-Hao Lai, Kaohsiung (TW); Ming-Hua Chang, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 94 days.

(21) Appl. No.: 13/850,887

(22) Filed: Mar. 26, 2013

(65) Prior Publication Data
US 2014/0295629 A1    Oct. 2, 2014

(51) Int. Cl.
*H01L 21/8238*    (2006.01)
*H01L 21/8234*    (2006.01)

(52) U.S. Cl.
CPC  *H01L 21/823814* (2013.01); *H01L 21/823412* (2013.01); *H01L 21/823425* (2013.01); *H01L 21/823807* (2013.01); *Y10S 438/938* (2013.01)

(58) Field of Classification Search
CPC ............ H01L 21/02532; H01L 29/6653
USPC ............. 438/213, 938, 303, 287, 153, 154
See application file for complete search history.

(56) References Cited

U.S. PATENT DOCUMENTS

| | | | |
|---|---|---|---|
| 4,891,303 A | 1/1990 | Garza et al. |
| 5,217,910 A | 6/1993 | Shimizu et al. |
| 5,273,930 A | 12/1993 | Steele et al. |
| 5,356,830 A | 10/1994 | Yoshikawa et al. |
| 5,372,957 A | 12/1994 | Liang et al. |
| 5,385,630 A | 1/1995 | Philipossian et al. |
| 5,399,506 A | 3/1995 | Tsukamoto |
| 5,625,217 A | 4/1997 | Chau et al. |
| 5,777,364 A | 7/1998 | Crabbe et al. |
| 5,783,478 A | 7/1998 | Chau et al. |
| 5,783,479 A | 7/1998 | Lin et al. |
| 5,960,322 A | 9/1999 | Xiang et al. |
| 6,030,874 A | 2/2000 | Grider et al. |
| 6,048,756 A | 4/2000 | Lee et al. |
| 6,074,954 A | 6/2000 | Lill et al. |
| 6,100,171 A | 8/2000 | Ishida |
| 6,110,787 A | 8/2000 | Chan et al. |
| 6,165,826 A | 12/2000 | Chau et al. |
| 6,165,881 A | 12/2000 | Tao et al. |

(Continued)

*Primary Examiner* — Brett Feeney
*Assistant Examiner* — Damian A Hillman
(74) *Attorney, Agent, or Firm* — J.C. Patents

(57) ABSTRACT

A method of forming a semiconductor device is disclosed. At least one gate structure is provided on a substrate, wherein the gate structure includes a first spacer formed on a sidewall of a gate. A first disposable spacer material layer is deposited on the substrate covering the gate structure. The first disposable spacer material layer is etched to form a first disposable spacer on the first spacer. A second disposable spacer material layer is deposited on the substrate covering the gate structure. The second disposable spacer material layer is etched to form a second disposable spacer on the first disposable spacer. A portion of the substrate is removed, by using the first and second disposable spacers as a mask, so as to form two recesses in the substrate beside the gate structure. A stress-inducing layer is formed in the recesses.

19 Claims, 3 Drawing Sheets

(56) References Cited

U.S. PATENT DOCUMENTS

| | | |
|---|---|---|
| 6,191,052 B1 | 2/2001 | Wang |
| 6,228,730 B1 | 5/2001 | Chen et al. |
| 6,274,447 B1 | 8/2001 | Takasou |
| 6,355,533 B2 | 3/2002 | Lee |
| 6,365,476 B1 | 4/2002 | Talwar et al. |
| 6,368,926 B1 | 4/2002 | Wu |
| 6,444,591 B1 | 9/2002 | Schuegraf et al. |
| 6,537,370 B1 | 3/2003 | Hernandez et al. |
| 6,544,822 B2 | 4/2003 | Kim et al. |
| 6,605,498 B1 | 8/2003 | Murthy et al. |
| 6,613,695 B2 | 9/2003 | Pomarede et al. |
| 6,621,131 B2 | 9/2003 | Murthy et al. |
| 6,624,068 B2 | 9/2003 | Thakar et al. |
| 6,632,718 B1 | 10/2003 | Grider et al. |
| 6,642,122 B1 | 11/2003 | Yu |
| 6,664,156 B1 | 12/2003 | Ang et al. |
| 6,676,764 B2 | 1/2004 | Joo |
| 6,699,763 B2 | 3/2004 | Grider et al. |
| 6,703,271 B2 | 3/2004 | Yeo et al. |
| 6,777,275 B1 | 8/2004 | Kluth |
| 6,806,151 B2 | 10/2004 | Wasshuber et al. |
| 6,809,402 B1 | 10/2004 | Hopper et al. |
| 6,858,506 B2 | 2/2005 | Chang |
| 6,861,318 B2 | 3/2005 | Murthy et al. |
| 6,864,135 B2 | 3/2005 | Grudowski et al. |
| 6,869,867 B2 | 3/2005 | Miyashita et al. |
| 6,887,751 B2 | 5/2005 | Chidambarrao et al. |
| 6,887,762 B1 | 5/2005 | Murthy et al. |
| 6,891,192 B2 | 5/2005 | Chen et al. |
| 6,930,007 B2 | 8/2005 | Bu et al. |
| 6,946,350 B2 | 9/2005 | Lindert et al. |
| 6,962,856 B2 | 11/2005 | Park et al. |
| 6,972,461 B1 | 12/2005 | Chen et al. |
| 6,991,979 B2 | 1/2006 | Ajmera et al. |
| 6,991,991 B2 | 1/2006 | Cheng et al. |
| 7,037,773 B2 | 5/2006 | Wang et al. |
| 7,060,576 B2 | 6/2006 | Lindert et al. |
| 7,060,579 B2 | 6/2006 | Chidambaram et al. |
| 7,112,495 B2 | 9/2006 | Ko et al. |
| 7,118,952 B2 | 10/2006 | Chen et al. |
| 7,132,338 B2 | 11/2006 | Samoilov et al. |
| 7,169,675 B2 | 1/2007 | Tan et al. |
| 7,183,596 B2 | 2/2007 | Wu et al. |
| 7,202,124 B2 | 4/2007 | Fitzgerald et al. |
| 7,217,627 B2 | 5/2007 | Kim |
| 7,288,822 B1 | 10/2007 | Ting et al. |
| 7,303,999 B1 | 12/2007 | Sriraman et al. |
| 7,335,959 B2 | 2/2008 | Curello et al. |
| 7,410,859 B1 | 8/2008 | Peidous et al. |
| 7,462,239 B2 | 12/2008 | Brabant et al. |
| 7,491,615 B2 | 2/2009 | Wu et al. |
| 7,494,856 B2 | 2/2009 | Zhang et al. |
| 7,494,858 B2 | 2/2009 | Bohr et al. |
| 7,592,231 B2 | 9/2009 | Cheng et al. |
| 7,667,227 B2 | 2/2010 | Shimamune et al. |
| 7,691,752 B2 | 4/2010 | Ranade et al. |
| 7,834,389 B2 * | 11/2010 | Huang et al. .................. 257/316 |
| 7,838,370 B2 | 11/2010 | Mehta et al. |
| 8,455,314 B2 * | 6/2013 | Griebenow et al. ............ 438/199 |
| 2002/0160587 A1 | 10/2002 | Jagannathan et al. |
| 2002/0182423 A1 | 12/2002 | Chu et al. |
| 2003/0181005 A1 | 9/2003 | Hachimine et al. |
| 2003/0203599 A1 | 10/2003 | Kanzawa et al. |
| 2004/0045499 A1 | 3/2004 | Langdo et al. |
| 2004/0067631 A1 | 4/2004 | Bu et al. |
| 2004/0227164 A1 | 11/2004 | Lee et al. |
| 2005/0070076 A1 | 3/2005 | Dion |
| 2005/0079692 A1 | 4/2005 | Samoilov et al. |
| 2005/0082616 A1 | 4/2005 | Chen et al. |
| 2005/0139231 A1 | 6/2005 | Abadie et al. |
| 2005/0260830 A1 | 11/2005 | Kwon et al. |
| 2005/0285193 A1 | 12/2005 | Lee et al. |
| 2005/0287752 A1 | 12/2005 | Nouri et al. |
| 2006/0051922 A1 | 3/2006 | Huang et al. |
| 2006/0057859 A1 | 3/2006 | Chen |
| 2006/0076627 A1 | 4/2006 | Chen et al. |
| 2006/0088968 A1 | 4/2006 | Shin et al. |
| 2006/0115949 A1 | 6/2006 | Zhang et al. |
| 2006/0163558 A1 | 7/2006 | Lee et al. |
| 2006/0228842 A1 | 10/2006 | Zhang et al. |
| 2006/0231826 A1 | 10/2006 | Kohyama |
| 2006/0258126 A1 | 11/2006 | Shiono et al. |
| 2006/0281288 A1 | 12/2006 | Kawamura et al. |
| 2006/0292779 A1 | 12/2006 | Chen et al. |
| 2006/0292783 A1 | 12/2006 | Lee et al. |
| 2007/0023847 A1 | 2/2007 | Rhee et al. |
| 2007/0034906 A1 | 2/2007 | Wang et al. |
| 2007/0049014 A1 | 3/2007 | Chen et al. |
| 2007/0072353 A1 | 3/2007 | Wu et al. |
| 2007/0072376 A1 | 3/2007 | Chen et al. |
| 2007/0082451 A1 | 4/2007 | Samoilov et al. |
| 2007/0128783 A1 | 6/2007 | Ting et al. |
| 2007/0166929 A1 | 7/2007 | Matsumoto et al. |
| 2007/0200179 A1 * | 8/2007 | Chen .............................. 257/369 |
| 2007/0262396 A1 | 11/2007 | Zhu et al. |
| 2008/0014688 A1 | 1/2008 | Thean et al. |
| 2008/0061366 A1 | 3/2008 | Liu et al. |
| 2008/0067545 A1 | 3/2008 | Rhee et al. |
| 2008/0076236 A1 | 3/2008 | Chiang et al. |
| 2008/0085577 A1 | 4/2008 | Shih et al. |
| 2008/0116525 A1 | 5/2008 | Liu et al. |
| 2008/0124874 A1 | 5/2008 | Park et al. |
| 2008/0128746 A1 | 6/2008 | Wang |
| 2008/0142886 A1 | 6/2008 | Liao et al. |
| 2008/0220579 A1 | 9/2008 | Pal et al. |
| 2008/0233722 A1 | 9/2008 | Liao et al. |
| 2008/0233746 A1 | 9/2008 | Huang et al. |
| 2009/0039389 A1 | 2/2009 | Tseng et al. |
| 2009/0045456 A1 | 2/2009 | Chen et al. |
| 2009/0095992 A1 | 4/2009 | Sanuki et al. |
| 2009/0117715 A1 | 5/2009 | Fukuda et al. |
| 2009/0124056 A1 | 5/2009 | Chen et al. |
| 2009/0166625 A1 | 7/2009 | Ting et al. |
| 2009/0184402 A1 | 7/2009 | Chen |
| 2009/0186475 A1 | 7/2009 | Ting et al. |
| 2009/0246922 A1 | 10/2009 | Wu et al. |
| 2009/0278170 A1 | 11/2009 | Yang et al. |
| 2009/0302348 A1 | 12/2009 | Adam et al. |
| 2010/0001317 A1 | 1/2010 | Chen et al. |
| 2010/0093147 A1 | 4/2010 | Liao et al. |
| 2012/0326243 A1 * | 12/2012 | Huang et al. .................. 257/410 |

* cited by examiner

METHOD OF FORMING SEMICONDUCTOR DEVICE

BACKGROUND OF THE INVENTION

1. Field of Invention

The present invention relates to a method of forming an integrated circuit, and more generally to a method of forming a semiconductor device.

2. Description of Related Art

In the field of integrated circuit devices, the dimensions of devices are often reduced to attain a higher operating speed and a lower power consumption. However, with the ever-increasing level of integration of devices, the miniaturization of devices has almost reached its limit. Strain engineering is one of the promising approaches to circumvent the scaling limit.

A method for strain control is utilizing materials having an identical crystal structure but different lattice constants to achieve the purpose of controlling the strain. If a transistor is an N-type transistor, implanted strain atoms are carbon atoms and formed into an epitaxial structure of silicon carbide (SiC). Since the lattice constant of carbon atoms is usually smaller than that of silicon atoms, if SiC is embedded in source and drain regions, a tensile stress can be generated in the channel to enhance the mobility of electrons so that the driving current of the device is increased. If a transistor is a P-type transistor, implanted strain atoms are germanium atoms and formed into an epitaxial structure of silicon germanium (SiGe). A compression stress can be generated in the channel to enhance the mobility of holes.

Therefore, controlling the strain in the channel region of a transistor is indeed a proposed solution to overcome the limitation imposed by the device miniaturization. However, it has been challenging to integrate the strain engineering into the existing CMOS process.

SUMMARY OF THE INVENTION

Accordingly, the present invention provides a method of forming a semiconductor structure, which successfully integrates the strain engineering into the existing CMOS process.

The present invention provides a method of forming a semiconductor device. At least one gate structure is provided on a substrate, wherein the gate structure includes a first spacer formed on a sidewall of a gate. A first disposable spacer material layer is deposited on the substrate covering the gate structure. The first disposable spacer material layer is etched to form a first disposable spacer on the first spacer. A second disposable spacer material layer is deposited on the substrate covering the gate structure. The second disposable spacer material layer is etched to form a second disposable spacer on the first disposable spacer. A portion of the substrate is removed, by using the first and second disposable spacers as a mask, to form two recesses in the substrate beside the gate structure. A stress-inducing layer is formed in the recesses.

In view of the above, when forming a disposable dual-spacer structure, the present invention adopts two deposition processes and two etching processes performed alternatively, so that each of the disposable double spacers of the invention is formed with an I-shape. The outer I-shaped disposable spacer (i.e. second disposable spacer) protects the inner I-shaped disposable spacer (i.e. first disposable spacer) from being damaged during the recess forming/enlarging step, so that undercuts at bottoms of the disposable spacers are not observed, and thus the process window and therefore the device performance are effectively improved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
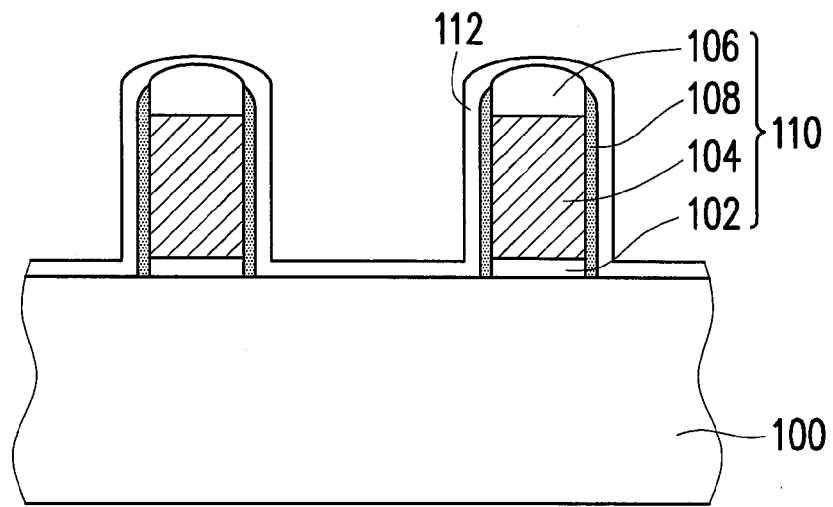
FIGS. 1A to 1F are schematic cross-sectional views illustrating a method of forming a semiconductor structure according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1F are schematic cross-sectional views illustrating a method of forming a semiconductor structure according to an embodiment of the present invention.

Referring to FIG. 1A, at least one gate structure 110 is provided on a substrate 100. The substrate 100 can be a semiconductor substrate, such as a silicon substrate. The gate structure 110 includes an interfacial layer 102, a gate 104 and a cap layer 106 sequentially formed on the substrate 100. The interfacial layer 102 includes silicon oxide, silicon oxynitride, a high-k material with a dielectric constant greater than 4, or a combination thereof. The high-k material can be metal oxide, such as rare earth metal oxide. The high-k material can be selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST), wherein x is between 0 and 1. The gate 104 includes amorphous silicon, polysilicon, doped polysilicon or silicon-containing material such as SiGe. The cap layer 106 includes silicon nitride or a combination of silicon oxide and silicon nitride. In this embodiment, the gate structure 110 further includes a first spacer 108 formed on the sidewall of the gate 104. The first spacer 108 includes silicon nitride.

The embodiment of FIG. 1A in which each of the interfacial layer 102 and the cap layer 106 is illustrated as a single layer is provided for illustration purposes and is not construed as limiting the invention. It should be appreciated by persons having ordinary skill in the art that each of the interfacial layer 102 and the cap layer 106 can be a composite layer or a multi-layer structure upon the process requirements.

The method of forming the gate structure 110 includes forming an interfacial material layer, a gate material layer and a cap material layer (not shown) sequentially on the substrate 100, patterning the said layers to form at least one stacked structure, forming a first spacer material layer (not shown) on the substrate 100 covering the stacked structure, and performing an anisotropic etching process to etched the first spacer material layer.

In an embodiment, for a polysilicon gate process, the gate structure 110 may include a silicon oxide layer or a silicon oxynitride layer as an interfacial layer (or called a gate dielectric layer), a polysilicon layer as a gate and a silicon nitride layer as a cap layer.

In another embodiment, for a metal gate (high-k first) process, the gate structure 110 may include a composite layer (containing a lower silicon oxide layer and an upper high-k layer) as an interfacial layer, a polysilicon layer as a dummy gate and a silicon nitride layer as a cap layer. In addition, a barrier layer (not shown) is further disposed between the high-k layer and the polysilicon layer. The barrier layer includes TiN.

In yet another embodiment, for a metal gate (high-k last) process, the gate structure 110 may include a silicon oxide layer as an interfacial layer, a polysilicon layer as a dummy gate and a silicon nitride layer as a cap layer.

After forming the first spacer 108, two lightly doped regions (not shown in FIG. 1A) are optionally formed in the substrate 100 beside the gate structure 110 by using the first spacer 108 as a mask. Or in another embodiment of the present invention, these two lightly doped regions are formed afterward.

Continue referring to FIG. 1A, a first disposable spacer material layer 112 is deposited on the substrate 100 covering the gate structure 110. The first disposable spacer material layer 112 includes silicon oxide and can be formed by an atomic layer deposition (ALD) process, a chemical vapor deposition (CVD) process, a physical vapor deposition (PVD) process or a sputter deposition process.

Figure 1B:
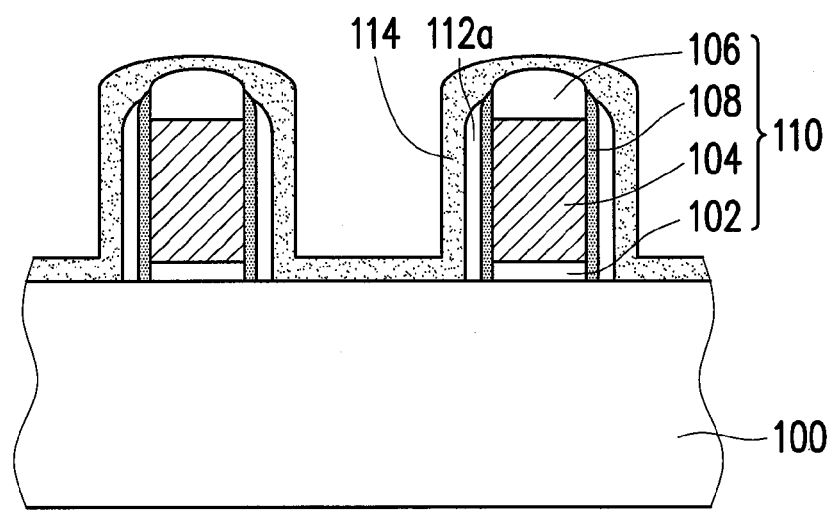

Referring to FIG. 1B, the first disposable spacer material layer 112 is etched to form a first disposable spacer 112a on the first spacer 108. The method of etching the first disposable spacer material layer 112 includes performing an anisotropic dry etching process.

Afterwards, a second disposable spacer material layer 114 is deposited on the substrate 100 covering the gate structure 110. The second disposable spacer material layer 114 includes silicon nitride and can be formed by an ALD process, a CVD process, a PVD process or a sputter deposition process.

Figure 1C:
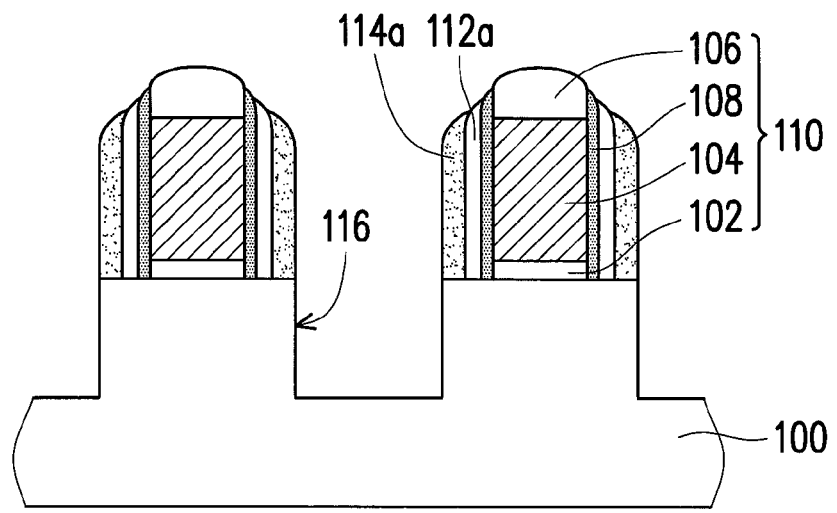

Referring to FIG. 1C, the second disposable spacer material layer 114 is etched to form a second disposable spacer 114a on the first disposable spacer 112a. The method of etching the second disposable spacer material layer 114 includes performing an anisotropic dry etching process.

Thereafter, a portion of the substrate 100 is removed, by using the first and second disposable spacers 112a and 114a as a mask, so as to form two recesses 116 in the substrate 100 beside the gate structure 110. In this embodiment, one recess 116 is formed in the substrate 100 between the adjacent gate structures 110. The method of removing the portion of the substrate 100 includes performing a dry etching process and/or a wet etching process.

Figure 1D:
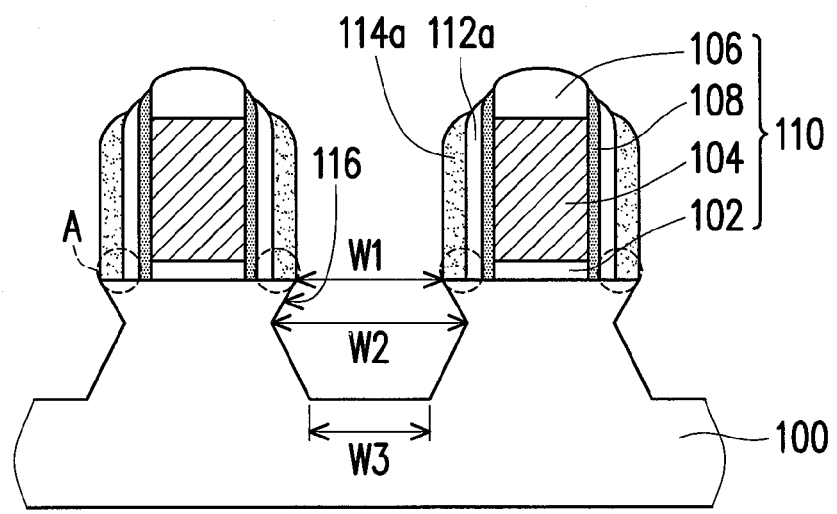

Referring to FIG. 1D, a middle width W2 of a middle portion of each recess 116 is optionally enlarged through said etching process. The said etching process can use a dry etching step to form vertical sidewall of the recess 116 as shown in FIG. 1C and use a wet etching step to enlarge the middle portion of the recess 116. Specifically, each recess 116 has a middle width W2 of the middle portion thereof between the top thereof and the bottom thereof, and the middle width W2 is the maximum width of the recess 116. In an embodiment, the top width W1 is close to, or even substantially equal to, the bottom width W3 of each recess 116. In another embodiment, the top width W1 can be different from the bottom width W3 of each recess 116.

It is noted that the conventional undercuts are not observed in areas A (marked as dotted lines in FIG. 1D) after the recess forming step and/or the recess enlarging step. Specifically, the conventional disposable dual-spacer structure is fabricated with two successive deposition processes and followed by one etching process. Thus, the inner disposable spacer adjacent to the gate structure has an L-shape, a vertical portion thereof covers the sidewall of the gate structure, and a lateral portion thereof extends from the bottom of the vertical portion over the substrate. However, one side of the lateral portion of the L-shaped inner disposable spacer is exposed after the etching process. Under such circumstance, during the subsequent recess forming step and/or the recess enlarging step, the etching gas or etchant permeates, through the exposed side, into the lateral portion of each L-shaped inner disposable spacer and therefore creates undercuts at areas A. Hence, the subsequently formed stress-inducing layer may be grown and extended into the undercuts, thereby causing leakage and device degradation.

On the other side, in the present invention, the disposable dual-spacer structure including the first and second disposable spacers 112a and 114a is fabricated with two deposition processes and two etching processes alternatively performed. Therefore, each of the first and second disposable spacers 112a and 114a is formed with an I-shape, and the outer second disposable spacer 114a covers the inner first disposable spacer 112a and protects the inner first disposable spacer 112a from being damaged by the etching gas or etchant used in the recess forming/enlarging step.

Figure 1E:
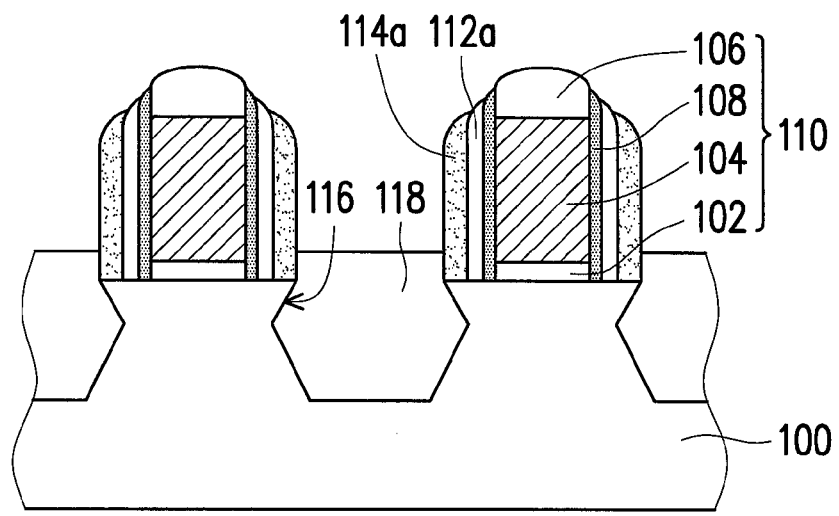

Referring to FIG. 1E, a stress-inducing layer 118 is formed in the recesses 116. The stress-inducing layer 118 includes silicon carbide (SiC) or silicon germanium (SiGe), and the forming method thereof includes performing a selective epitaxy growth (SEG) process. In an embodiment, the surface of the stress-inducing layer 118 is higher than the surface of the substrate 100, as shown in FIG. 1E. In another embodiment (not shown), the surface of the stress-inducing layer 118 can be substantially coplanar with the surface of the substrate 100. Herein, since the conventional undercuts are not observed at bottoms of the first and second disposable spacers 112a and 114a, the stress-inducing layer 118 is formed without extending into the first and second disposable spacers 112a and 114a, and thus, leakage does not occur and the device performance is improved.

Figure 1F:
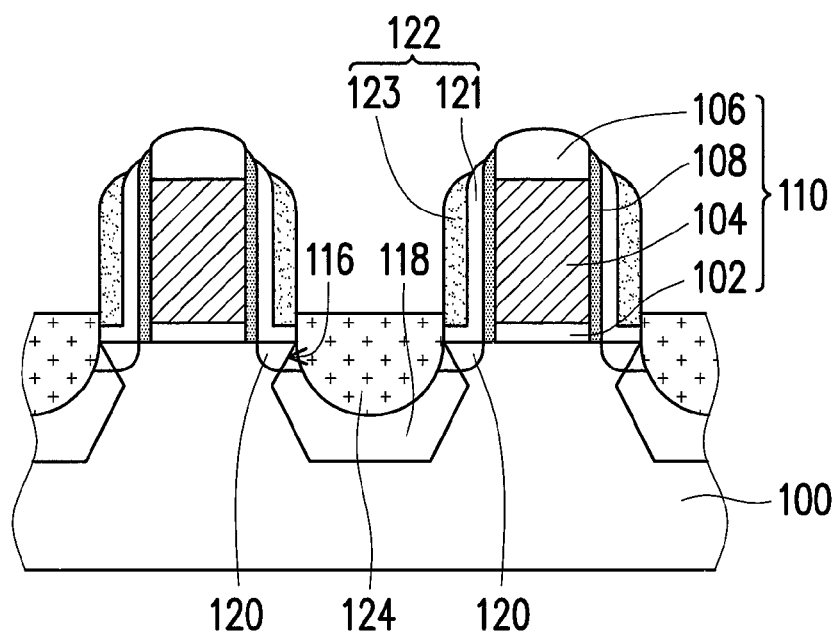

Referring to FIG. 1F, the first and second disposable spacers 112a and 114a are removed through an etching process. Thereafter, two lightly doped regions 120 are formed in the substrate 100 beside the gate structure 110 by using the first spacer 108 as a mask if these two lightly doped regions are not formed right after forming of the first spacer 108. In this embodiment, two lightly doped regions 120 are formed in a portion of the substrate 100 and in a portion of the stress-inducing layer 118 between the adjacent gate structures 110. The method of forming the lightly doped regions 120 includes performing an ion implantation process. When manufacturing an N-type transistor, the ion utilized is an N-type dopant such as phosphorous or arsenic. When manufacturing a P-type transistor, the ion utilized is a P-type dopant such as boron or boron fluoride.

Afterwards, a second spacer 122 is formed on the first spacer 108. In an embodiment, the second spacer 120 can be a dual-spacer structure including an L-shaped inner spacer layer 121 on the first spacer 108 and an outer spacer layer 123 on the L-shaped inner layer 121. The L-shaped inner spacer layer 121 includes a vertical portion covering the sidewall of the gate structure 110, and a lateral portion extending from the bottom of the vertical portion over the substrate 100. The L-shaped inner spacer layer 121 includes silicon oxide and the outer spacer layer 123 includes silicon nitride. The method of forming the second spacer 122 includes sequentially depositing a silicon oxide layer and a silicon nitride layer on the substrate 100 covering the gate structure 110, and then performing an anisotropic dry etching step to remove a portion of the silicon oxide layer and a portion of the silicon nitride layer.

Then, two heavily doped regions 124 are formed in the stress-inducing layer 118 beside the gate structure 110 by using the second spacer 122 as a mask. The method of forming the heavily doped regions 124 includes performing an ion implantation process. In this embodiment, one heavily doped region 124 is formed in the substrate 100 (or in the stress-inducing layer 118) between the adjacent gate structures 110. When manufacturing an N-type transistor, the ion utilized is an N-type dopant such as phosphorous or arsenic. When manufacturing a P-type transistor, the ion utilized is a P-type dopant such as boron or boron fluoride.

In an embodiment, for a polysilicon gate process, the following process steps after forming the heavily doped regions 124 include forming contact plugs, forming interconnection metals etc. (not shown), which are well-known to persons having ordinary skill in the art and are not iterated herein.

In another embodiment, for a metal gate (high-k first) process, the following process steps after forming the heavily doped regions 124 include forming a dielectric layer (not shown) which exposes the top of each gate structure 110 on the substrate 100, removing the cap layer 106 and the dummy gate 104 to form openings in the dielectric layer, and filling a composite metal layer including a work function metal layer (e.g. TiAl or TiN) and a low-resistivity metal layer (e.g. Al or Cu) in the openings. These steps are well-known to persons having ordinary skill in the art and are not iterated herein.

In yet another embodiment, for a metal gate (high-k last) process, the following process steps after forming the heavily doped regions 124 include forming a dielectric layer (not shown) which exposes the top of each gate structure 110 on the substrate 100, removing the cap layer 106, the dummy gate 104 and the interfacial layer 102 to form openings in the dielectric layer, and filling a gate dielectric layer (e.g. silicon oxide), a high-k layer (e.g. $HfO_2$), a barrier layer (e.g. TiN) and a composite metal layer including a work function metal layer (e.g. TiAl or TiN) and a low-resistivity metal layer (e.g. Al or Cu) in the openings. These steps are well-known to persons having ordinary skill in the art and are not iterated herein.

In summary, when forming a disposable dual-spacer structure, the present invention adopts two deposition processes and two etching processes performed alternatively to replace the conventional two successive deposition processes and followed by one etching process. Therefore, each of the disposable double spacers of the invention is formed to have an I-shape rather than an L-shape. The outer I-shaped disposable spacer (i.e. second disposable spacer) protects the inner I-shaped disposable spacer (i.e. first disposable spacer) from being damaged during the recess forming/enlarging step, so that undercuts at bottoms of the disposable spacers are not observed, and thus the process window and therefore the device performance are effectively improved. Besides, with the method of the invention, it is easy to integate the strain engineering into the existing CMOS process, thereby achieving competitive advantages over competitors.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of forming a semiconductor device, comprising:
   providing at least one gate structure on a substrate, wherein the gate structure comprises a first spacer formed on a sidewall of a gate;
   depositing a first disposable spacer material layer on the substrate covering the gate structure;
   etching the first disposable spacer material layer to form a first disposable spacer on the first spacer;
   depositing a second disposable spacer material layer on the substrate covering the gate structure;
   etching the second disposable spacer material layer to form a second disposable spacer on the first disposable spacer;
   removing a portion of the substrate by using the first and second disposable spacers as a mask, so as to form two recesses in the substrate beside the gate structure;
   forming a stress-inducing layer in the recesses;
   removing the first and second disposable spacers;
   forming a second spacer on the first spacer; and
   forming two heavily doped regions in the stress-inducing layer beside the gate structure by using the second spacer as a mask.

2. The method of claim 1, wherein the step of depositing the first disposable spacer material layer comprises performing an ALD process, a CVD process, a PVD process or a sputter deposition process.

3. The method of claim 1, wherein the step of etching the first disposable spacer material layer comprises performing an anisotropic dry etching process.

4. The method of claim 1, wherein the step of depositing the second disposable spacer material layer comprises performing an ALD process, a CVD process, a PVD process or a sputter deposition process.

5. The method of claim 1, wherein the step of etching the second disposable spacer material layer comprises performing an anisotropic dry etching process.

6. The method of claim 1, wherein the step of removing the portion of the substrate to form the recesses comprises performing a dry etching process and/or a wet etching process.

7. The method of claim 1, wherein the first spacer comprises silicon nitride.

8. The method of claim 1, wherein the first disposable spacer material layer comprises silicon oxide.

9. The method of claim 1, wherein the second disposable spacer material layer comprises silicon nitride.

10. The method of claim 1, further comprising, after the step of forming the recesses in the substrate and before the step of forming the stress-inducing layer in the recesses, enlarging a middle width of a middle portion of each recess.

11. The method of claim 1, wherein the second spacer is a dual-spacer structure comprising an L-shaped inner spacer layer on the first spacer and an outer spacer layer on the L-shaped inner layer.

12. The method of claim 11, wherein the L-shaped inner spacer layer comprises silicon oxide and the outer spacer layer comprises silicon nitride.

13. The method of claim 1, further comprising, after the step of removing the first and second disposable spacers and before the step of forming the second spacer, forming two lightly doped regions in the substrate beside the gate structure.

14. The method of claim 1, wherein the gate is a dummy gate.

15. The method of claim 1, wherein the gate structure comprises an interfacial layer, the gate and a cap layer sequentially formed on the substrate.

16. The method of claim 15, wherein the interfacial layer comprises silicon oxide, silicon oxynitride, a high-k material with a dielectric constant greater than 4, or a combination thereof.

17. The method of claim 15, wherein the gate comprises polysilicon.

18. The method of claim 15, wherein the cap layer comprises silicon nitride.

19. The method of claim 1, wherein the stress-inducing layer comprises silicon carbide or silicon germanium.

\* \* \* \* \*